US012812956B2

(12) United States Patent
Shih et al.

(10) Patent No.: US 12,812,956 B2
(45) Date of Patent: Nov. 24, 2026

(54) MULTICOMPONENT-ALLOY MATERIAL LAYER, METHOD OF MANUFACTURING THE SAME AND CAPACITOR STRUCTURE OF SEMICONDUCTOR DEVICE

(71) Applicant: NATIONAL CHENG KUNG UNIVERSITY, Tainan City (TW)

(72) Inventors: Chuan-Feng Shih, Tainan City (TW); Wen-Dung Hsu, Tainan City (TW); Bernard Hao-Chih Liu, Tainan City (TW); Chung-Hung Hung, Tainan City (TW); Hsuan-Ta Wu, Changhua County (TW); Cheng-Hsien Yeh, Tainan City (TW)

(73) Assignee: NATIONAL CHENG KUNG UNIVERSITY, Tainan City (TW)

( * ) Notice: Subject to any disclaimer, the term of this patent is extended or adjusted under 35 U.S.C. 154(b) by 875 days.

(21) Appl. No.: 17/933,854

(22) Filed: Sep. 21, 2022

(65) Prior Publication Data

US 2023/0343848 A1 Oct. 26, 2023

(30) Foreign Application Priority Data

Apr. 26, 2022 (TW) ................................ 111115887

(51) Int. Cl.
*C22C 30/02* (2006.01)
*C22C 30/06* (2006.01)
*H10D 64/66* (2025.01)

(52) U.S. Cl.
CPC ........... *H10D 64/667* (2025.01); *C22C 30/02* (2013.01); *C22C 30/06* (2013.01); *H10D 64/66* (2025.01)

(58) Field of Classification Search
CPC .......... C22C 19/01; C22C 19/03; C22C 19/07
See application file for complete search history.

(56) References Cited

U.S. PATENT DOCUMENTS

| | | | |
|---|---|---|---|
| 7,667,278 | B2 | 2/2010 | Cabral, Jr. et al. |
| 2011/0222210 | A1 | 9/2011 | Fujiwara |

FOREIGN PATENT DOCUMENTS

| | | | |
|---|---|---|---|
| CN | 103928233 | A | 7/2014 |
| CN | 107564969 | A | 1/2018 |
| CN | 113061766 | A | 7/2021 |
| JP | 2010-028004 | A | 2/2010 |
| JP | 2015128151 | A | 7/2015 |
| JP | 2016-028462 | A | 2/2016 |

(Continued)

OTHER PUBLICATIONS

English Translation of KR20090104340A obtained form EPO espacenet Jul. 25, 2025. (Year: 2025).*

*Primary Examiner* — Adam Krupicka
(74) *Attorney, Agent, or Firm* — CKC & Partners Co., LLC

(57) ABSTRACT

The present invention relates to a multicomponent-alloy material layer and a method of manufacturing the multicomponent-alloy material layer and a capacitor structure of a semiconductor device comprising the multicomponent-alloy material layer. The multicomponent-alloy material layer has four to six metal elements and has specific two kinds of metal components, and the two kinds of metal components have a specific content ratio, such that without a thermal annealing treatment, the multicomponent-alloy material layer has a specific work function for an application in the capacitor structure of the semiconductor device.

15 Claims, 5 Drawing Sheets

(56) References Cited

FOREIGN PATENT DOCUMENTS

| | | | |
|---|---|---|---|
| JP | 2016-111254 | A | 6/2016 |
| KR | 1020090104340 | A | 10/2009 |
| TW | 201926620 | A | 7/2019 |
| TW | 202130831 | A | 8/2021 |

* cited by examiner

MULTICOMPONENT-ALLOY MATERIAL LAYER, METHOD OF MANUFACTURING THE SAME AND CAPACITOR STRUCTURE OF SEMICONDUCTOR DEVICE

RELATED APPLICATION

This application claims priority to an earlier Taiwan Application Serial Number 111115887, filed on Apr. 26, 2022 which is incorporated herein by reference in its entirety.

BACKGROUND

Field of Invention

The present invention relates to a multicomponent-alloy material layer, a method of manufacturing the same and a capacitor structure, and more particularly relates to the multicomponent-alloy material layer, the method of manufacturing the same and the capacitor structure with a work function allowable to apply in a semiconductor device.

Description of Related Art

A capacitor structure of a semiconductor device can be metal-oxide-semiconductor capacitor (MOSCAP) structure generally used as a gate structure of a metal oxide semiconductor field effect transistor (MOSFET). A manufacture of the capacitor structure comprises depositing an oxide layer on one side of a base layer, then depositing a metal layer (as a bottom electrode layer) on the other side of the base layer and depositing a binary metal layer (as a top electrode layer) on the oxide layer to obtain a stacked layer.

Since the binary metal layer does not have a work function allowable to apply in the capacitor structure of MOS, there is a need to perform an annealing treatment on the binary metal layer, such that the binary metal layer is allowable to apply in the capacitor structure of MOS after it has an appropriate work function. For example, work functions suitable for applying in the capacitor structures of p-type MOS and the capacitor structures of n-type MOS can be not less than 4.7 eV and not more than 4.3 eV, respectively. However, the annealing treatment may cause variations in other layers beyond the binary metal layer, e.g. damages due to chemical deterioration or physical embrittlement, etc. Besides, a thermal treatment (such as a heating treatment or an annealing treatment) performed on other layers also may cause damages to the binary metal layer with poor thermal stability. Accordingly, conventional capacitor structures of MOS are necessary to be adjusted and seriously controlled conditions such as temperature, period and atmosphere of the annealing treatment, which increases difficulties of manufacturing processes and increases manufacturing cost.

In view of these, it is necessary to develop a new multicomponent-alloy material layer, a method of manufacturing the same and a capacitor structure to solve the aforementioned drawbacks.

SUMMARY

In view of the above problems, an aspect of the present invention is to provide a multicomponent-alloy material layer. The multicomponent-alloy material layer has four to six metal elements, and is made of specific two kinds of metal element components having a specific content ratio, and therefore the multicomponent-alloy material layer has a specific work function, thereby being allowable to apply in a capacitor structure of a semiconductor device.

Another aspect of the present invention is to provide a method of manufacturing the multicomponent-alloy material layer. In the method, the aforementioned specific metal element composition is used to manufacture the multicomponent-alloy material layer, and thus the multicomponent-alloy material layer with the specific work function can be manufactured without a thermal annealing treatment, thereby simplifying manufacturing processes.

Yet another aspect of the present invention is to provide a capacitor structure of a semiconductor device. The capacitor structure comprises the aforementioned multicomponent-alloy material layer, and therefore the capacitor structure can be applied in the semiconductor device.

According to one embodiment of the present invention, the multicomponent-alloy material layer is provided. The multicomponent-alloy material layer comprises a composition shown as a following formula:

$$XY$$

in which the multicomponent-alloy material layer has four to six metal elements.

X represents a first metal element composition, and the first metal element composition is one to four metal elements selected from a group consisted of manganese, niobium, molybdenum, vanadium, tungsten, rhenium, titanium and copper. Y represents a second metal element composition, and the second metal element composition is one to three metal elements selected from a group consisted of zinc, cobalt, nickel, palladium, magnesium, zirconium and hafnium. A content ratio of X to Y is 0.05 to 2.00, and a work function of the multicomponent-alloy material layer is not less than 4.7 eV or not more than 4.3 eV.

According to another embodiment of the present invention, the first metal element composition is one to four metal elements selected from a group consisted of molybdenum, tungsten, rhenium, manganese, vanadium and niobium, the second metal element composition is one to three metal elements selected from a group consisted of zinc, cobalt, nickel and palladium, and the work function is 4.7 eV to 5.3 eV.

According to yet another embodiment of the present invention, the multicomponent-alloy material layer is an alloy material layer with four or five metal elements, and a content difference between a metal element having a maximum work function in the second metal element composition and a metal element having a minimum work function in the first metal element composition is 25 at % to 35 at %.

According to yet another embodiment of the present invention, the multicomponent-alloy material layer is an alloy material layer with four or five metal elements, and a content ratio of a metal element having a maximum work function to a metal element having a sub-maximum work function in the first metal element composition and the second metal element composition is 0.9 to 1.1.

According to yet another embodiment of the present invention, a variation of the work function is not more than 5.5% after the multicomponent-alloy material layer is kept at 500° C. for 1 minute.

According to yet another embodiment of the present invention, the first metal element composition is one to two metal elements selected from a group consisted of titanium and copper, the second metal element composition is one to three metal elements selected from a group consisted of magnesium, zirconium, and hafnium, and the work function is 3.8 eV to 4.3 eV.

According to yet another embodiment of present invention, the multicomponent-alloy material layer is an alloy material layer with four or five metal elements, and a content difference between a metal element having a minimum work function in the second metal element composition and a metal element having a maximum work function in the first metal element composition is 25 at % to 35 at %.

According to yet another embodiment of present invention, the multicomponent-alloy material layer is an alloy material layer with four or five metal elements, and a content ratio of a metal element having a minimum work function to a metal element having a sub-minimum work function in the first metal element composition and the second metal element composition is 0.9 to 1.1.

According to yet another embodiment of present invention, a variation of the work function is not more than 5.5% after the multicomponent-alloy material layer is kept at 300° C. for 1 minute.

According to yet another embodiment of present invention, a thickness of the multicomponent-alloy material layer is not more than 100 nm.

According to another aspect of the present invention, a method of manufacturing a multicomponent-alloy material layer is provided. The method comprises forming the multicomponent-alloy material layer by using a composition shown as a following formula: XY, and the method of manufacturing the multicomponent-alloy material layer excludes an annealing treatment. The multicomponent-alloy material layer has four to six metal elements.

X represents a first metal element composition, and the first metal element composition is one to four metal elements selected from a group consisted of manganese, niobium, molybdenum, vanadium, tungsten, rhenium, titanium and copper. Y represents a second metal element composition, and the second metal element composition is one to three metal elements selected from a group consisted of zinc, cobalt, nickel, palladium, magnesium, zirconium and hafnium. A content ratio of X to Y is 0.05 to 2.00, and a work function of the multicomponent-alloy material layer is not less than 4.7 eV or not more than 4.3 eV.

According to another aspect of the present invention, a capacitor structure of a semiconductor device is provided. The capacitor structure comprises an electrode layer, an oxide layer, a base layer disposed between the electrode layer and the oxide layer, and a multicomponent-alloy material layer, in which the base layer contacts to one of two sides of the oxide layer, and the multicomponent-alloy material layer is disposed on the other side of the oxide layer. The multicomponent-alloy material layer comprises a composition shown as a following formula: XY, in which the multicomponent-alloy material layer has four to six metal elements.

X represents a first metal element composition, and the first metal element composition is one to four metal elements selected from a group consisted of manganese, niobium, molybdenum, vanadium, tungsten, rhenium, titanium and copper. Y represents a second metal element composition, and the second metal element composition is one to three metal elements selected from a group consisted of zinc, cobalt, nickel, palladium, magnesium, zirconium and hafnium. A content ratio of X to Y is 0.05 to 2.00, and a work function of the multicomponent-alloy material layer is not less than 4.7 eV or not more than 4.3 eV.

In an application of the multicomponent-alloy material layer, the method of manufacturing the same, and the capacitor structure of the semiconductor device of the present invention, in which the multicomponent-alloy material layer has four to six metal elements, and has specific two kinds of metal components, such that the multicomponent-alloy material layer has a specific work function allowable to apply in the capacitor structure of a semiconductor device with taking advantage of the two kinds of metal components with the specific content ratio without the thermal annealing treatment, thereby simplifying manufacturing processes and increasing production.

BRIEF DESCRIPTION OF THE DRAWINGS

Now please refer to description below and accompany with corresponding drawings to more fully understand embodiments of the present invention and advantages thereof. It has to be emphasized that all kinds of characteristics are not drawn in scale and only for illustrative purpose. The description regarding to the drawings as follows.

DETAILED DESCRIPTION

Figure 1:
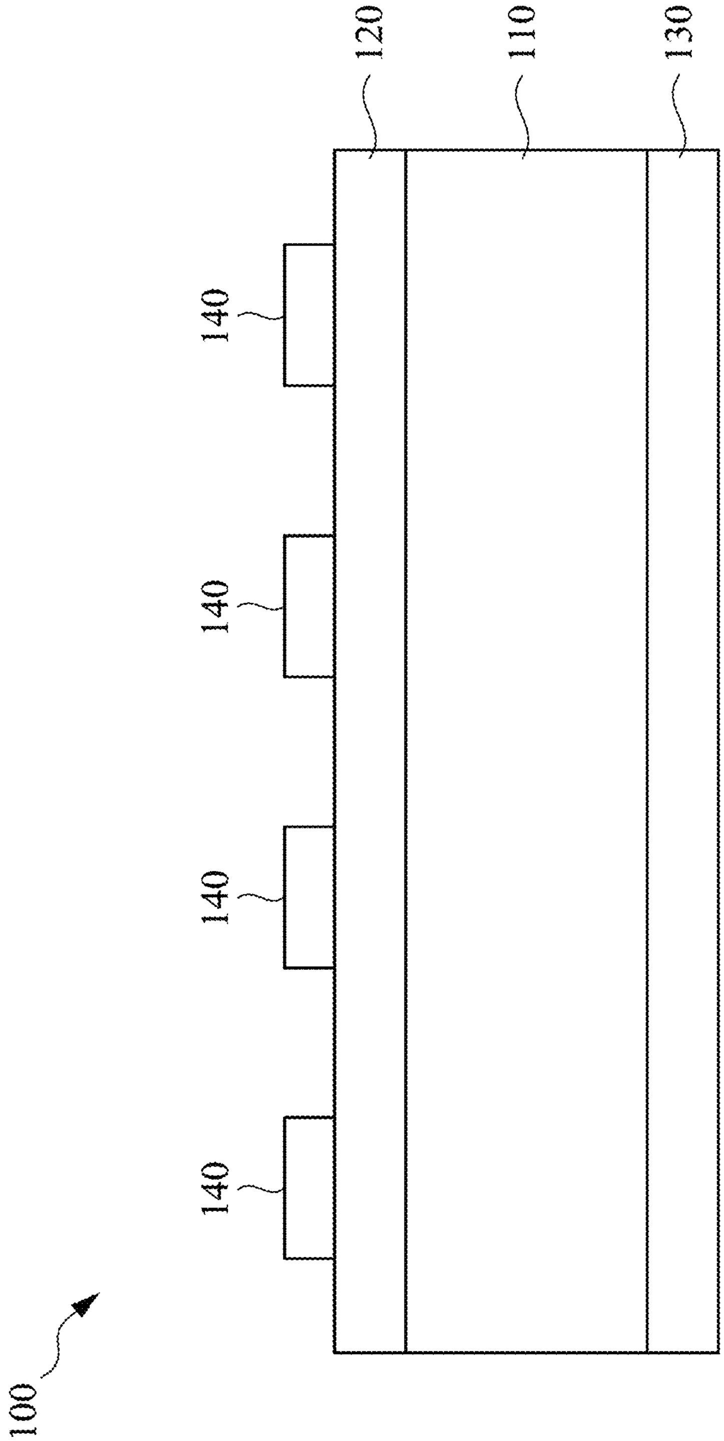
FIG. 1 illustrates a schematic view of a capacitor structure of MOS according to an embodiment of the present invention.

A manufacturing and usage of embodiments of the present invention are discussed in detail below. However, it could be understood that embodiments provide much applicable invention conception which can be implemented in various kinds specific contents. The specific embodiments discussed are only for illustration, but not be a limitation of scope of the present invention.

A multicomponent-alloy material layer of the present invention has four to six metal elements and comprises a composition shown as a following formula:

XY.

X represents a first metal element composition, and the first metal element composition is one to four metal elements selected from a group consisted of manganese, niobium, molybdenum, vanadium, tungsten, rhenium, titanium and copper. Y represents a second metal element composition, and the second metal element composition is one to three metal elements selected from a group consisted of zinc, cobalt, nickel, palladium, magnesium, zirconium and hafnium. A content ratio of X to Y is 0.05 to 2.00 and preferably can be 0.10 to 1.90. The multicomponent-alloy material layer has a work function of not less than 4.7 eV or not more than 4.3 eV, and therefore the multicomponent-alloy material layer can be applied in the capacitor structure of p-type MOS and the capacitor structure of n-type MOS, respectively. If the first metal element composition and/or the second metal element composition is not the aforementioned metal element composition corresponding thereto, a work function of a resulted multicomponent-alloy material layer is more than 4.3 eV or less than 4.7 eV, or thermal stability of the resulted multicomponent-alloy material layer is poor, and thus the resulted multicomponent-alloy material layer is not suitable for applying in the capacitor structure of the semiconductor device. If the content ratio of X to Y is less than 0.05 or more than 2.00, the work function of the resulted multicomponent-alloy material layer is more than 4.3 eV and less than 4.7 eV, or thermal stability of the resulted multicomponent-alloy material layer is poor, and thus the resulted multicomponent-alloy material layer is not suitable for applying in the capacitor structure of the semiconductor device.

In some embodiments, the first metal element composition is one to four metal elements selected from a group consisted of molybdenum, tungsten, rhenium, manganese, vanadium, niobium, and the second metal element composition is one to three metal elements selected from a group consisted of zinc, cobalt, nickel and palladium. When the first metal element composition and the second metal element composition are the aforementioned metal element composition corresponding thereto, the work function of the resulted multicomponent-alloy material layer is 4.7 eV to 5.30 eV, and therefore the resulted multicomponent-alloy material layer is more suitable for applying in the capacitor structure of p-type MOS. The work function of the multicomponent-alloy material layer can be not still substantially varied, and therefore the multicomponent-alloy material layer has good thermal stability after the multicomponent-alloy material layer is kept at 500° C. for 1 minute.

In yet another embodiment, the first metal element composition is one to two metal elements selected from a group consisted of titanium and copper, and the second metal element composition is one to three metal element selected from a group consisted of magnesium, zirconium, and hafnium. When the first metal element composition and the second metal element composition are the aforementioned metal element compositions corresponding thereto, the work function of the resulted multicomponent-alloy material layer is 3.8 eV to 4.3 eV, and therefore the resulted multicomponent-alloy material layer is suitable for applying in the capacitor structure of n-type MOS. The work function of the multicomponent-alloy material layer can be not still substantially varied after the multicomponent-alloy material layer is kept at 300° C. for 1 minute, and therefore the multicomponent-alloy material layer has good thermal stability.

In some embodiments, in the multicomponent-alloy material layer of the present invention, a content difference between a metal element having a maximum work function in the second metal element composition and a metal element having a minimum work function in the first metal element composition is 25 at % to 35 at %. When the metal elements in the first metal element composition and the second metal element composition meet the content difference. Depending on difference in conductivity for subsequent applications, the resulted multicomponent-alloy material layer can have an appropriate work function and have better thermal stability. Preferably, the content difference can be 30 at %.

In some embodiments, in the first metal element composition and the second metal element composition of the multicomponent-alloy material layer of the present invention, a content ratio of a metal element having a maximum work function to a metal element having a sub-maximum work function is 0.9 to 1.1, such that a variation of the work function of the resulted multicomponent-alloy material layer is not more than 5.5% after the resulted multicomponent-alloy material layer is subjected to a thermal annealing treatment, and thus the thermal stability of the resulted multicomponent-alloy material layer is further enhanced. Preferably, the content ratio can be 1.0.

For example, in alloy materials with body-centered cubic (BCC) packing and face-centered cubic (FCC) packing, work functions of metal elements "manganese, niobium, molybdenum, vanadium, tungsten, rhenium, titanium, copper, zinc, cobalt, nickel, palladium, magnesium, zirconium and hafnium" are 4.1, 4.49, 4.51, 4.74, 4.76, 4.88, 4.42, 4.88, 4.08, 4.92, 5.02, 5.2, 3.76, 4.18 and 4.34 eV, respectively.

A thickness of the multicomponent-alloy material layer can be not more than 100 nm, preferably can be 20 nm to 80 nm, and more preferably can be 20 nm to 50 nm. When the thickness of the multicomponent-alloy material layer is in the aforementioned range, the multicomponent-alloy material layer can be more suitable for applying in miniaturized capacitor structures of MOS.

Besides, a method of manufacturing a multicomponent-alloy material layer is provided in the present invention. The method comprises forming the multicomponent-alloy material layer by using the aforementioned composition shown as the formula: XY and can exclude an annealing treatment.

In the method of the present invention, the multicomponent-alloy material layer are formed by the aforementioned specific first metal element composition and the aforementioned specific second metal element composition, and a specific content ratio of the two kinds of metal element compositions are controlled (i.e. a content ratio of the first metal element composition to the second metal element composition is 0.05 to 2.00), such that without the thermal annealing treatment, the resulted multicomponent-alloy material layer has the appropriate work function (not less than 4.7 eV or not more than 4.3 eV). Therefore, the resulted multicomponent-alloy material layer can be applied in a suitable capacitor structure of the semiconductor device depending on conductive properties of the resulted multicomponent-alloy material layer for simplifying manufacturing processes and increasing production. The method of forming the multicomponent-alloy material layer is not particularly limited, but the purpose is accomplishment of manufacturing the multicomponent-alloy material layer with the aforementioned work function. For example, the method of forming the multicomponent-alloy material layer can comprise sputtering, evaporation, atomic layer deposition and a manner commonly used by a person having ordinary skill in the art of the present invention.

Referring to FIG. 1, a capacitor structure 100 of a semiconductor device of the present invention comprises a base layer 110, an oxide layer 120, an electrode layer 130 and a multicomponent-alloy material layer 140. The base layer 110 is disposed between the oxide layer 120 and the electrode layer 130. The multicomponent-alloy material layer 140 is disposed on the oxide layer 120. The base layer 110 and the multicomponent-alloy material layer 140 are disposed on two sides of the oxide layer 120, respectively. In some embodiments, the capacitor structure 100 can be metal oxide semiconductor capacitor (MOSCAP) structure, in which the electrode layer 130 can be used as a bottom electrode layer, and the multicomponent-alloy material layer 140 can be used as a top electrode layer. For example, when applied in a metal-oxide-semiconductor field-effect transistor (MOSFET), the electrode layer 130 can be used as a body electrode, and the multicomponent-alloy material layer 140 can be used as a gate electrode.

In some embodiments, the base layer 110 can include, but is not limited to, a semiconductor substrate, such as a silicon wafer. The oxide layer 120 can include, but is not limited to, silicon dioxide or other suitable material. The electrode layer

130 can include, but is not limited to, aluminum or other suitable metal material. The multicomponent-alloy material layer 140 can be manufactured by the aforementioned method of manufacturing the multicomponent-alloy material layer. Since the multicomponent-alloy material layer 140 can have the appropriate work function without the thermal annealing treatment, the base layer 110, the oxide layer 120 and the electrode layer 130 are not suffered to damages caused by the thermal annealing treatment which is necessary to be performed on a conventional material layer made of binary metal. In addition, the multicomponent-alloy material layer 140 also has a good thermal stability, and thus the work function of the multicomponent-alloy material layer 140 also does not vary easily with the thermal treatment to which the base layer 110, the oxide layer 120, the electrode layer 130 or other material layer are subjected.

The following embodiments are used to illustrate the applications of the present invention, but they are not used to limit the present invention, it could be made various changes or modifications for a person having ordinary sill in the art without apart from the spirit and scope of the present invention.

Manufacturing of Capacitor Structure of MOS

EMBODIMENT 1-1

In the manufacture of the capacitor structure of MOS of embodiment 1-1, a silicon wafer was washed by a standard RCA (Radio Corporation of America) cleaning process, then a silicon dioxide layer (as an oxide layer) with a thickness of 20 nm to 100 nm was deposited on one side of the silicon wafer by using an evaporation system with E-beam, and an aluminum layer with a thickness of 100 nm was deposited on the other side of the silicon wafer by using a RF (Radio Frequency) magnetron sputter system. Next, the aluminum layer was heated to 400° C. at a heating rate of 500° C./sec by using a rapid thermal annealing (RTA) system, and kept for 1 minute for manufacturing a bottom electrode layer (i.e. a thermal annealed aluminum layer). Then, a multicomponent-alloy material layer (as a top electrode layer) was deposited on a silicon dioxide layer by using an electrode mask with a diameter of 1 mm and target material containing metal elements shown in embodiment 1-1 of Table 1, for manufacturing the capacitor structure of MOS of embodiment 1-1.

EMBODIMENTS 1-2 to 1-19 AND EMBODIMENTS 2-1 to 2-3

Embodiments 1-2 to 1-19 and embodiments 2-1 to 2-3 were practiced with the same method as in embodiment 1-1 by using various metal element composition. Specific conditions and evaluated results of these embodiments were shown in Table 1 and FIGS. 3 to 5.

Evaluation Methods

1. Test of Work Function

Figure 2:
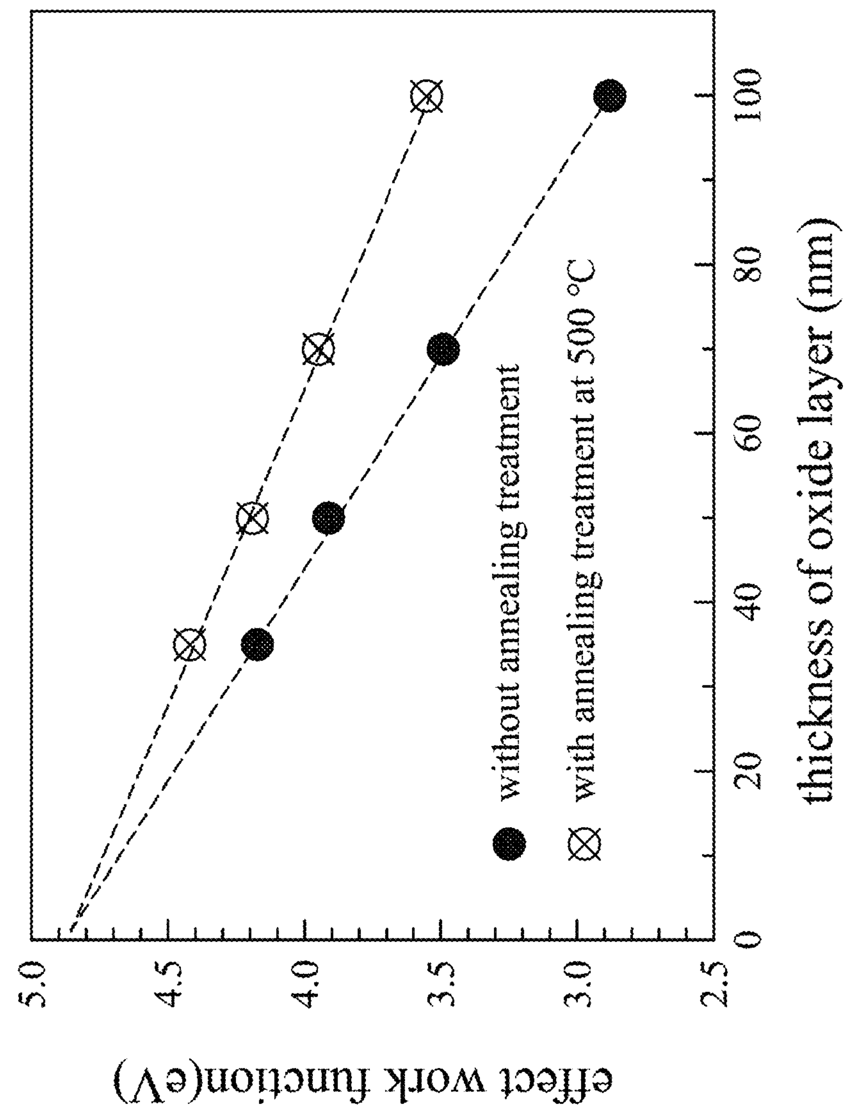
FIGS. 2 to 3 illustrate graphs of effect work function versus thickness of oxide layer according to two embodiments of the present invention, respectively.
Figure 3:
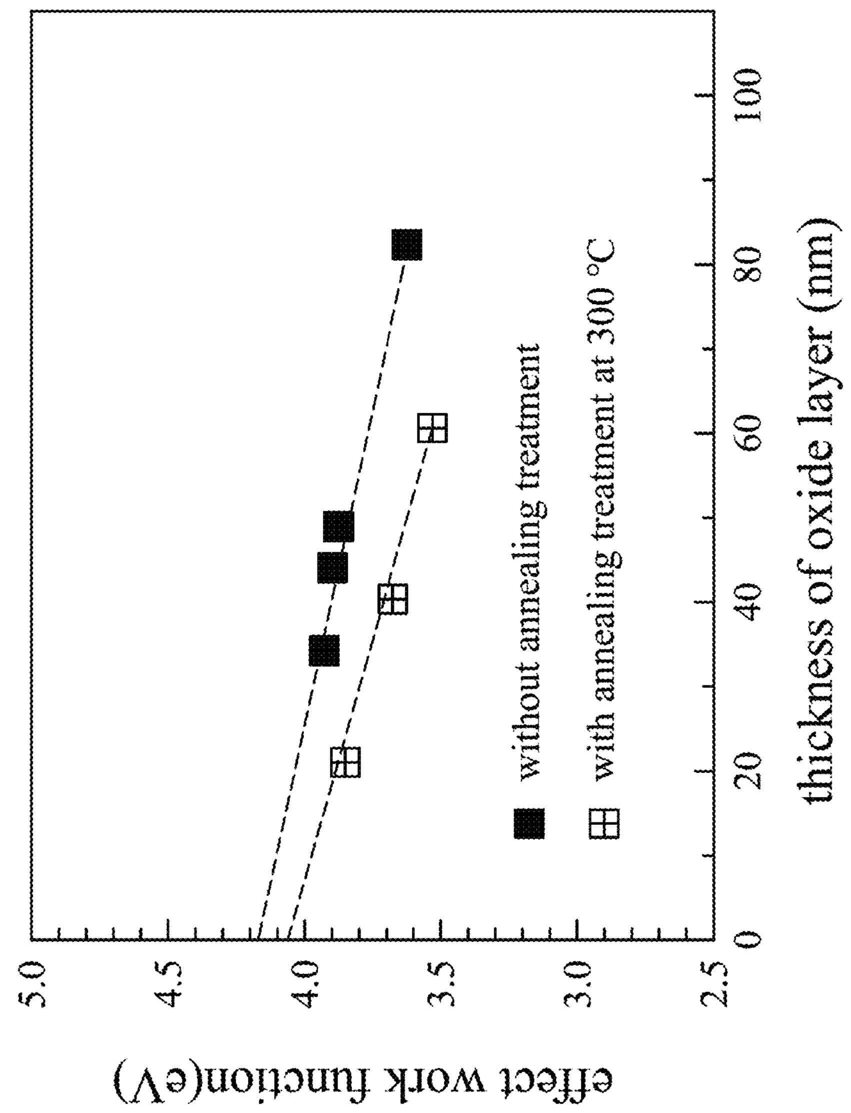

In the test of the work function, a capacitance-voltage curve (C-V curve) of the capacitor structure of MOS was measured and then a graph of effect work function versus thickness of oxide layer was plotted, a Y-axis intercept of the graph was the work function of the multi-component alloy material layer. FIG. 2 and FIG. 3 illustrated the aforementioned graphs of effect work function versus thickness of oxide layer according to the capacitor structure of MOS of embodiments 1-1 and 2-1, respectively. The work functions of the capacitor structures were shown in Table 1.

2. Test of Thermal Stability

In the test of the thermal stability, the work function of the capacitor structure of MOS was first measured. Then, at a vacuum pressure of 30 mTorr, the capacitor structure of MOS was heated to 500° C. or 300° C. at a heating rate of 50° C./sec by rapid thermal annealing equipment (manufactured by Premtek International Inc., and Mode No. was 3615A). After the thermal treatment for 1 minute, the work function of the capacitor structure of MOS was measured, and based on the work function of the capacitor structure of MOS before the thermal treatment, a variation of the work function between before and after the thermal treatment was calculated. When the variation of the work function was not more than 5.5%, the work function of the multicomponent-alloy material layer of the capacitor structure was not substantially varied, and the multicomponent-alloy material layer had good thermal stability.

3. Test of Thickness of Multicomponent-Alloy Material Layer

Figure 4:
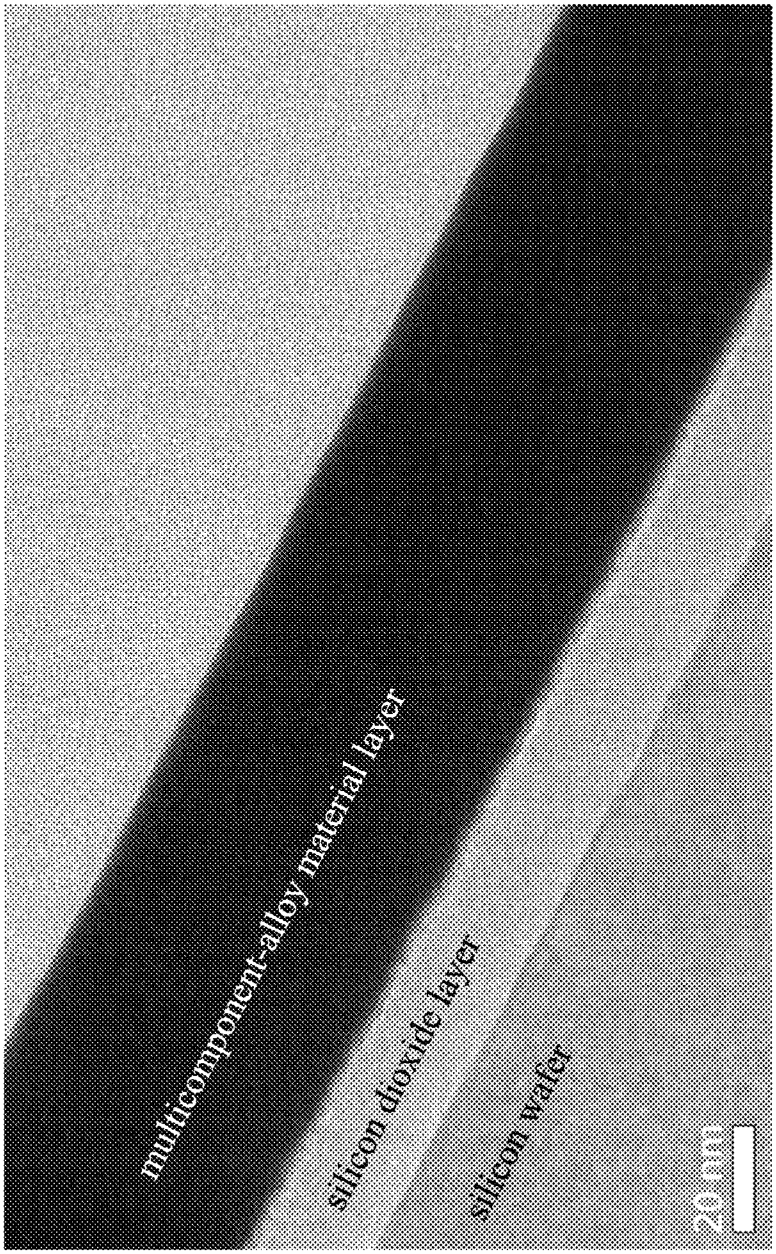
FIGS. 4 to 5 are pictures of cross-sections of a capacitor structure of MOS taken by a transmission electron microscope according to two embodiments of the present invention, respectively.
Figure 5:
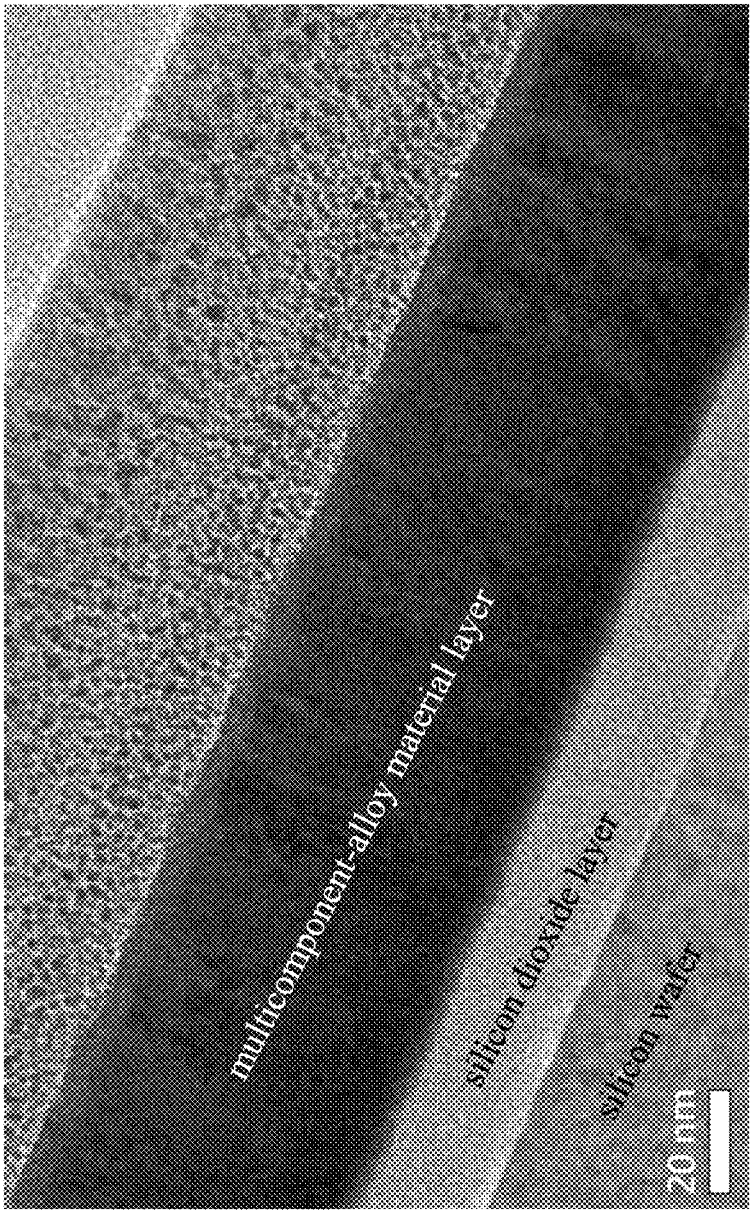

In the test of the thickness of the multicomponent-alloy material layer, pictures of cross-sections of the capacitor structure of MOS of embodiments 1-1 and 2-1 were taken by a transmission electron microscope (TEM) shown in FIGS. 4 and 5, respectively. Then the thicknesses of the multicomponent-alloy material layers of the capacitor structures of MOS were measured by using software for measuring a distance. The thicknesses of the multicomponent-alloy material layers of embodiments 1-1 and 2-1 were measured as 55 nm and 56 nm, respectively. The thicknesses of the multicomponent-alloy material layers of the other embodiments were in a range between 20 nm and 50 nm.

TABLE 1

| | | Alloy material | First metal element composition (X)(content at. %) | | | | | | | | | Second metal element composition (Y)(content at. %) | | | | | | content ratio of X to Y | Work function Without thermal annealing treatment (eV) |
|---|---|---|---|---|---|---|---|---|---|---|---|---|---|---|---|---|---|---|---|
| | | | Mn | Nb | Mo | V | W | Re | Ti | Cu | Zn | Co | Ni | Pd | Mg | Zr | Hf | | |
| Embodiment | 1-1 | MoWCoNi | — | — | 5 | — | 25 | — | — | — | — | 35 | 35 | — | — | — | — | 0.43 | 4.88~4.91 |
| | 1-2 | MoReCoNi | — | — | 5 | — | — | 25 | — | — | — | 35 | 35 | — | — | — | — | 0.43 | 4.87~4.97 |
| | 1-3 | MoCoNiPd | — | — | 5 | — | — | — | — | — | — | 25 | 35 | 35 | — | — | — | 0.05 | 4.98~5.08 |
| | 1-4 | MoVReCo | — | — | 5 | 25 | — | 35 | — | — | — | 35 | — | — | — | — | — | 1.57 | 4.79~4.89 |
| | 1-5 | MoWReCo | — | — | 5 | — | 25 | 35 | — | — | — | 35 | — | — | — | — | — | 1.57 | 4.79~4.89 |
| | 1-6 | MoReCoPd | — | — | 5 | — | — | 25 | — | — | — | 35 | — | 35 | — | — | — | 0.43 | 4.93~5.03 |
| | 1-7 | MoWCoPd | — | — | 5 | — | 25 | — | — | — | — | 35 | — | 35 | — | — | — | 0.43 | 4.90~5.00 |
| | 1-8 | MoReCoNiPd | — | — | 5 | — | — | 5 | — | — | — | 20 | 35 | 35 | — | — | — | 0.11 | 4.98~5.08 |
| | 1-9 | MnMoReCoNi | 5 | — | 5 | — | — | 20 | — | — | — | 35 | 35 | — | — | — | — | 0.43 | 4.84~4.94 |
| | 1-10 | MoWCoNiPd | — | — | 5 | — | 5 | — | — | — | — | 20 | 35 | 35 | — | — | — | 0.11 | 4.97~5.07 |

TABLE 1-continued

| | Alloy | First metal element composition (X)(content at. %) | | | | | | | | Second metal element composition (Y)(content at. %) | | | | | | | content ratio of | Work function Without thermal annealing |
|---|---|---|---|---|---|---|---|---|---|---|---|---|---|---|---|---|---|---|
| | material | Mn | Nb | Mo | V | W | Re | Ti | Cu | Zn | Co | Ni | Pd | Mg | Zr | Hf | X to Y | treatment (eV) |
| 1-11 | MoWReCoNi | — | — | 5 | — | 5 | 20 | — | — | — | 35 | 35 | — | — | — | — | 0.43 | 4.87~4.97 |
| 1-12 | NbMoVReCo | — | 5 | 5 | 20 | — | 35 | — | — | — | 35 | — | — | — | — | — | 1.86 | 4.78~4.88 |
| 1-13 | MnMoWReCo | 5 | — | 5 | — | 20 | 35 | — | — | — | 35 | — | — | — | — | — | 1.86 | 4.76~4.86 |
| 1-14 | MoVWReCo | — | — | 5 | 5 | 20 | 35 | — | — | — | 35 | — | — | — | — | — | 1.86 | 4.79~4.89 |
| 1-15 | NbMoWReCo | — | 5 | 5 | — | 20 | 35 | — | — | — | 35 | — | — | — | — | — | 1.86 | 4.78~4.88 |
| 1-16 | MoWReCoPd | — | — | 5 | — | 5 | 20 | — | — | — | 35 | — | 35 | — | — | — | 0.43 | 4.93~5.03 |
| 1-17 | MoWReCoNiPd | — | — | 5 | — | 5 | 5 | — | — | — | 15 | 35 | 35 | — | — | — | 0.18 | 4.97~5.07 |
| 1-18 | MnMoWReCoNi | 5 | — | 5 | — | 5 | 15 | — | — | — | 35 | 35 | — | — | — | — | 0.43 | 4.83~4.93 |
| 1-19 | MoVReZnCo | — | — | 5 | 20 | — | 35 | — | — | 5 | 35 | | | | | | 1.5 | 4.76~4.86 |
| 2-1 | TiCuMgZrHf | — | — | — | — | — | — | 5 | 5 | — | — | — | — | 35 | 35 | 20 | 0.11 | 4.09~4.19 |
| 2-2 | TiMgZrHf | — | — | — | — | — | — | 5 | — | — | — | — | — | 35 | 35 | 25 | 0.05 | 4.03~4.13 |
| 2-3 | MnNbMoZn | 35 | 25 | 5 | — | — | — | — | — | 35 | — | — | — | — | — | — | 1.86 | 4.16~4.26 |

"—" represented that the metal element as described was not included in the alloy material.
The content ratios of X to Y were rounded off.

Referring to Table 1, in the multicomponent-alloy material layers of embodiments 1-1 to 1-19, the content ratios of the first metal element composition to the second metal element composition were controlled, such that the work functions were in a range between 4.7 eV and 5.1 eV, thereby being allowable to apply in capacitor structures of the p-type capacitor structure of MOS. Besides, in the multicomponent-alloy material layers of embodiments 1-1 to 1-19, the content ratios of the first metal element composition to the second metal element composition were controlled, such that the work functions were in a range between 4.0 eV and 4.3 eV, thereby being allowable to apply in capacitor structures of the n-type capacitor structures of MOS. In addition, for the quarternary alloy material layer of embodiment 1-1 and the quinary alloy material layer of embodiment 2-1, variations of the work functions between before and after the thermal treatment were 0% to 1.22% and 2.4% to 5.2%, respectively, thus they both had good thermal stability.

In summary, in an application of the multicomponent-alloy material layer, the method of manufacturing the same and the capacitor structure of the present invention, in where the multicomponent-alloy material layer has four to six metal elements, and has specific two kinds of metal element components, the two metal element components has a specific content ratio, such that without the thermal annealing treatment, the multicomponent-alloy material layer has a specific work function capable of being applied in the capacitor structure of the semiconductor device, thereby simplifying manufacturing processes and increasing production.

Although the present invention has been disclosed in several embodiments as above mentioned, these embodiments do not intend to limit the present invention. Various changes and modifications can be made by a person having ordinary skills in the art of the present invention, without departing from the spirit and scope of the present invention. Therefore, the claimed scope of the present invention shall be defined by the appended claims.

What is claimed is:

1. A multicomponent-alloy material layer, comprising a composition shown as a following formula:

XY wherein the multicomponent-alloy material layer has four to six metal elements;

X represents a first metal element composition, the first metal element composition is one to four metal elements selected from a group consisting of manganese, niobium, molybdenum, vanadium, tungsten, rhenium, titanium and copper;

Y represents a second metal element composition, the second metal element composition is one to three metal elements selected from a group consisting of zinc, cobalt, nickel, palladium, magnesium, zirconium and hafnium;

a content ratio of X to Y is 0.05 to 2.00;

when the first metal element composition is one to four metal elements selected from a group consisting of manganese, niobium, molybdenum, vanadium, tungsten, and rhenium, and the second metal element composition is one to three metal elements selected from a group consisting of zinc, cobalt, nickel, and palladium;

a work function of the multicomponent-alloy material layer is not less than 4.7 eV; and when the first metal element composition is one to two metal elements selected from a group consisting of titanium and copper, the second metal element composition is one to three metal elements selected from a group consisting of magnesium, zirconium, and hafnium;

a work function of the multicomponent-alloy material layer is not more than 4.3 eV.

2. The multicomponent-alloy material layer of claim 1, wherein when the first metal element composition is one to four metal elements selected from a group consisting of manganese, niobium, molybdenum, vanadium, tungsten, rhenium, and the second metal element composition is one to three metal elements selected from a group consisting of zinc, cobalt, nickel, and palladium, the work function of the multicomponent-alloy material layer is 4.7 eV to 5.3 eV.

3. The multicomponent-alloy material layer of claim 2, wherein the multicomponent-alloy material layer is an alloy material layer with four or five metal elements, and a content difference between a metal element having a maximum work function in the second metal element composition and a metal element having a minimum work function in the first metal element composition is 25 at % to 35 at %.

4. The multicomponent-alloy material layer of claim 2, wherein the multicomponent-alloy material layer is an alloy material layer with four or five metal elements, and a content ratio of a metal element having a maximum work function to a metal element having a sub-maximum work function in the first metal element composition and the second metal element composition is 0.9 to 1.1.

5. The multicomponent-alloy material layer of claim 2, wherein a variation of the work function is not more than 5.5% after the multicomponent-alloy material layer is kept at 500° C. for 1 minute.

6. The multicomponent-alloy material layer of claim 1, wherein when the first metal element composition is one to two metal elements selected from a group consisting of titanium and copper, the second metal element composition is one to three metal elements selected from a group consisting of magnesium, zirconium, and hafnium, the work function is 3.8 eV to 4.3 eV.

7. The multicomponent-alloy material layer of claim 6, wherein the multicomponent-alloy material layer is an alloy material layer with four or five metal elements, and a content difference between a metal element having a minimum work function in the second metal element composition and a metal element having a maximum work function in the first metal element composition is 25 at % to 35 at %.

8. The multicomponent-alloy material layer of claim 6, wherein the multicomponent-alloy material layer is an alloy material layer with four or five metal elements, and a content ratio of a metal element having a minimum work function to a metal element having a sub-minimum work function in the first metal element composition and the second metal element composition is 0.9 to 1.1.

9. The multicomponent-alloy material layer of claim 6, wherein, a variation of the work function is not more than 5.5% after the multicomponent-alloy material layer is kept at 300° C. for 1 minute.

10. The multicomponent-alloy material layer of claim 1, wherein a thickness of the multicomponent-alloy material layer is not more than 100 nm.

11. A method of manufacturing a multicomponent-alloy material layer, comprising:

forming the multicomponent-alloy material layer by using a composition shown as a following formula:

XY wherein the method of manufacturing the multicomponent-alloy material layer excludes an annealing treatment:

wherein the multicomponent-alloy material layer has four to six metal elements;

X represents a first metal element composition, the first metal element composition is one to four metal elements selected from a group consisted of manganese, niobium, molybdenum, vanadium, tungsten, rhenium, titanium and copper;

Y represents a second metal element composition, the second metal element composition is one to three metal elements selected from a group consisted of zinc, cobalt, nickel, palladium, magnesium, zirconium and hafnium;

a content ratio of X to Y is 0.05 to 2.00; and a work function of the multicomponent-alloy material layer is not less than 4.7 eV or not more than 4.3 eV.

12. The method of manufacturing the multicomponent-alloy material layer of claim 11, wherein the first metal element composition is one to four metal elements selected from a group consisted of molybdenum, tungsten, rhenium, manganese, vanadium and niobium, the second metal element composition is one to three metal elements selected from a group consisted of zinc, cobalt, nickel and palladium, and the work function is 4.7 eV to 5.3 eV.

13. The method of manufacturing the multicomponent-alloy material layer of claim 11, wherein the first metal element composition is one to two metal elements selected from a group consisted of titanium and copper, the second metal element composition is one to three metal elements selected from a group consisted of magnesium, zirconium, and hafnium, and the work function is 3.8 eV to 4.3 eV.

14. The method of manufacturing the multicomponent-alloy material layer of claim 11, wherein a thickness of the multicomponent-alloy material layer is not more than 50 nm.

15. A capacitor structure of a semiconductor device, comprising:

an electrode layer;

an oxide layer;

a base layer disposed between the electrode layer and the oxide layer, wherein the base layer contacts to one of two sides of the oxide layer; and a multicomponent-alloy material layer disposed on the other one of the two sides of the oxide layer, wherein the multicomponent-alloy material layer comprises a composition shown as a following formula:

XY wherein the multicomponent-alloy material layer has four to six metal elements;

X represents a first metal element composition, the first metal element composition is one to four metal elements selected from a group consisting of manganese, niobium, molybdenum, vanadium, tungsten, rhenium, titanium and copper;

Y represents a second metal element composition, the second metal element composition is one to three metal elements selected from a group consisting of zinc, cobalt, nickel, palladium, magnesium, zirconium and hafnium;

a content ratio of X to Y is 0.05 to 2.00, and a work function of the multicomponent-alloy material layer is not less than 4.7 eV.

* * * * *